United States Patent [19]

Gumbert et al.

[11] Patent Number: 4,476,626
[45] Date of Patent: Oct. 16, 1984

[54] DEVICE FOR TRANSFERRING LEADLESS COMPONENTS TO A GIVEN MOUNTING POSITION ON A CIRCUIT BOARD

[75] Inventors: Hans Gumbert, Sinn; Norbert Eufinger, Limburg, both of Fed. Rep. of Germany

[73] Assignee: U.S. Philips Corporation, New York, N.Y.

[21] Appl. No.: 449,037

[22] Filed: Dec. 13, 1982

[30] Foreign Application Priority Data

Dec. 23, 1981 [DE] Fed. Rep. of Germany ....... 3150945

[51] Int. Cl.$^3$ .............................................. H05K 3/34
[52] U.S. Cl. ........................................ 29/740; 29/743; 29/759; 29/834; 29/840
[58] Field of Search ................. 29/740, 743, 741, 759, 29/834, 840; 414/627, 737, 744 B, 752; 228/6 A, 6 R

[56] References Cited

U.S. PATENT DOCUMENTS 3,887,996  6/1975  Hartleroad et al. ............. 29/740 X
4,393,579  7/1983  Van Hooreweder ............. 29/740

Primary Examiner—Carl E. Hall
Attorney, Agent, or Firm—Jack E. Haken; James J. Cannon, Jr.

[57] ABSTRACT

A device for transferring leadless components from a carrier type to a given mounting position on a circuit board. Removal of the components from the tape is effected by means of a punch and a suction pick-up. The component is pulled along alignment walls of a feeding channel into a slide chamber of a transfer slide. After having received the component, the slide moves to an end position; the component is lifted by a suction tube into an alignment chamber and is then placed on the circuit board. From the instant of transfer from the tape to the instant of mounting on the circuit board, the component is permanently held by suction due to subatmospheric pressure. Even after withdrawal of the suction pick-up, a subatmospheric pressure is maintained in the slide which holds the component during displacement of the slide until the suction tube lifts it again. From the instant at which it is transferred from the tape to the instant at which it is placed in the mounting position, the component never becomes free again. The alignment of the component is considerably facilitated and improved. A first alignment takes place in the feeding channel and a second alignment in the slide chamber and finally in the alignment chamber.

2 Claims, 3 Drawing Figures

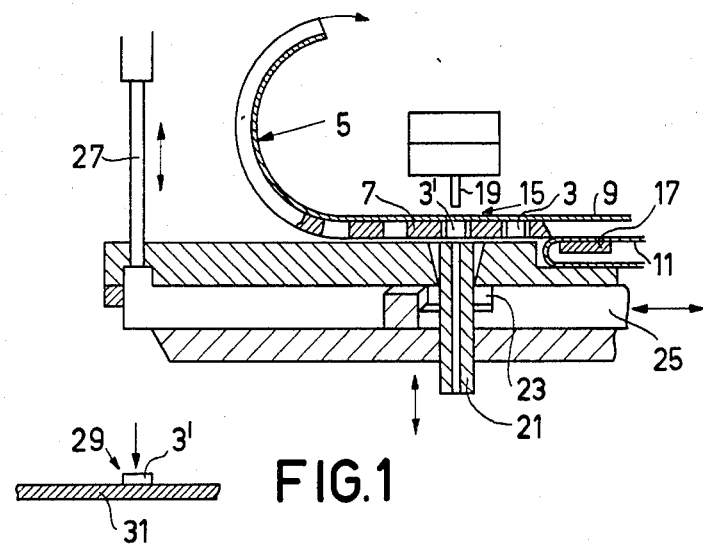
FIG.1
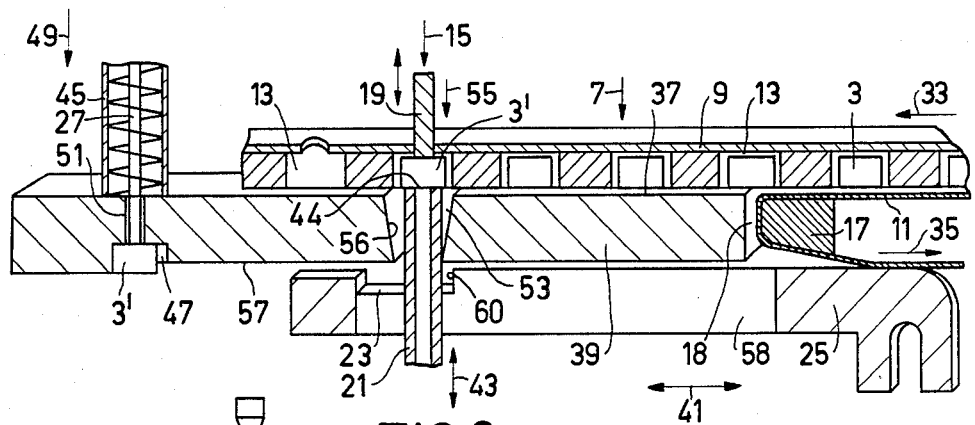
FIG.2
FIG.3

DEVICE FOR TRANSFERRING LEADLESS COMPONENTS TO A GIVEN MOUNTING POSITION ON A CIRCUIT BOARD

BACKGROUND OF THE INVENTION

1. Field of the Invention

The invention relates to a device for transferring leadless components, in particular so-called chip-type components, from a carrier tape to a given mounting position on a circuit board, the components being supplied by the tape at regular intervals and a punch feeding each component via a feeding channel in a guiding bottom to a transfer slide.

2. Description of the Prior Art

With a view to saving of construction material and to the larger rationalization as well as to the space-saving manner of arranging components on a circuit boards, components have been developed which can be directly soldered onto circuit boards. These components are extremely small and have for instance a width and a length of approximately 1.8 and 2.9 mm, while their height is chosen to be of the order of 0.5 mm. Such components, for example resistors or capacitors, have become known as "chips" in the technique of mounting electronic components.

These small electronic components are supplied by means of carrier tapes to the mounting apparatus. The carrier tapes consist of a tape portion provided with cavities which are spaced at regular intervals and which approximately correspond to the size of the largest component used. The components are disposed in the cavities and are held therein during the transport by means of upper and lower covering foils. In the mounting apparatus known from the U.S. patent application Ser. No. 235,802 filed Feb. 2, 1981, now U.S. Pat. No. 4,393,579, the components are then removed from the tape by means of a punch and are placed by means of a suction tube in the given mounting position on the circuit board.

However, it has been found that the exact mounting position can be attained only with difficulty and that mounting errors are of frequent occurrence. These mounting errors are mainly due on the one hand to the finding of the accurate mounting position and on the other hand to the relative position of the small component during its transfer. A very small rotation leads to positioning errors and hence at the same time to circuit errors, since in general the conductor pattern on the circuit board has an extraordinarily high density.

SUMMARY OF THE INVENTION

The invention has for its object to provide a device of the kind mentioned in the preamble, which permits of obtaining a perfect removal of the component from the tape and which brings the component on its way along the transport path into a relative position in which it can then be accurately placed in the desired mounting position on the circuit board.

According to the invention this is achieved in that below the punch is arranged a suction pick-up which can be displaced axially and synchronously with this punch while the component is aligned between this pick-up suction and the punch on its way towards the transfer slide in the feeding channel and is prevented from being separated from the pick-up suction until the component reaches in the slide the bottom of the slide chamber, and the suction pick-up projecting into a slot of the transfer slide, after the component has been disposed on the bottom of the slide chamber and after the suction pick-up has been lifted off the component, maintains a subatmospheric pressure which further holds the component on the bottom of the slide chamber until the component has been transferred by means of the transfer slide into a position above the mounting position and is lifted out of the slide chamber by a suction tube.

The punch and the pick-up suction entrap the component on the upper and the lower side respectively, and push and pull it, respectively, while it is aligned in the alignment channel, into the slide chamber. Once released by the punch and the suction pick-up, the component is held on the bottom of the slide chamber by means of a permanent subatmospheric pressure; the component, held on the bottom of the slide chamber, is transferred by the slide to a position above the mounting position. The suction tube then lifts the component out of the slide chamber and, after the slide has returned, places it into the mounting position on the circuit board. The positioning of the component on the circuit board is thus freed from the sliding and displacement errors occurring hitherto during the transfer of the component.

According to a further embodiment of the invention a short surge of pressurized air is applied to the suction tube when the component is placed onto the circuit board. Thus, the placement of the component on the circuit board is facilitated.

BRIEF DESCRIPTION OF THE DRAWINGS

In order that the invention may be readily carried out, it will now be described more fully, by way of example, with reference to the accompanying drawing, in which:

FIG. 1 shows a simplified overall representation of the device in cross-sectional view, FIG. 2 is a sectional view of an enlarged part of the device, a transfer slide being in the feeding position for receiving a component, and FIG. 3 shows the construction of FIG. 2, the component being brought by the transfer slide, into an end position above its mounting position on a circuit board.

DESCRIPTION OF THE PREFERRED EMBODIMENT

In the overall representation shown in FIG. 1, the individual components 3 are supplied by means of a carrier tape 5. This tape consists of the tape part 7 and upper and lower foils 9 and 11 covering the tape part 7 on the upper and on the lower side. The tape is provided with cavities 13 in which the components 3 are disposed. Before the feeding position 15 the lower foil 11 is separated from the tape part 7 by means of a separation member 17. Between the head of the separation member 17 and a guiding bottom is provided a gap 18 of the order of approximately 0.1 mm.

In the feeding position 15, a punch 19 is arranged above the cavity 13 which is in said position. A suction pick-up 21 is arranged below the tape and below the punch 19. The punch 19 and the suction pick-up 21 feed the component 3' to the slide chamber 23 of a transfer slide 25. By the displacement of the transfer slide 25, the component 3' can be transferred to a suction tube 27, by means of which the component 3' is brought to the desired mounting position 29 on a circuit board 31.

FIGS. 2 and 3 illustrate with reference to an enlarged representation the principle, according to which the transfer device operates. The carrier tape 5 is supplied stepwise to the device, as shown in FIG. 1, in the direction of arrow 33. The lower foil 11 is then pulled off around the separation member 17 in the direction of arrow 35. Thus, the components 3 are then no longer resting on the lower foil and, guided by the tape part 7, are slid over the upper side 37 of the guiding bottom 39. Below the guiding bottom 39, the transfer slide 25 can be displaced in the direction of double arrow 41. In a longitudinal slot 58 of the slide 25, the suction pick-up 21 is disposed, which can be displaced in the direction of double arrow 43 in and through the slot 58 in the slide 25 upwards and downwards.

In order to remove a component 3' from the carrier tape 5, the suction pick-up 21 is moved upwards. Its upper receiving surface 44 is located in its highest position—i.e. the pick-up position—in the plane of the upper side 37 of the guiding bottom. The component 3' is now slid onto the receiving surface 44 by the tape 13 advancing by one step. Subsequently, the punch 19 is moved downwards, pierces the upper foil 9 and moves up to a small distance from the component 3' picked up by the suction pick-up 21. The suction pick-up 21 and the punch 19 are then displaced downwards synchronously while maintaining said distance. Thus, although the component 3' is trapped, it is not subjected to pressure.

The component 3' now reaches a feeding channel 53. This feeding channel 53 is provided with tapering alignment walls 56 in the feeding direction which is indicated by arrow 55. At its widest area on the upper side 37 of the guiding bottom, it has the width of the cavity 13. At its narrowest area, which is located on the lower side 57 of the guiding bottom the feeding channel 53 has a shape, which with respect to its size corresponds to the dimensions of the components and with respect to its position corresponds to the relative position of the components.

The individual components 3 are first held with clearance in the cavities 13. Consequently, they can be both displaced transversely to the carrier tape and be rotated with respect to the tape. This misorientation is not very large but lies for the mounting position above the tolerance limits. Therefore, the component has to be aligned. The first alignment for eliminating the type tolerances is carried out on it in the feeding channel 53.

In the feeding channel 53, the component 3' is stuck to the receiving surface 44 due to the subatmospheric pressure in the suction pick-up during the downward movement, but is displaceable and slidable and also separable. It is now displaced or slid along the alignment walls 56 of the feeding channel until it reaches the correct position on the lower side 57 of the guiding bottom 39. During this period of time, the punch 19 following this movement ensures that the component 3' is not separated or detached from the suction pick-up. The feeding step is terminated when the component 3' is placed with the suction pick-up pulled downwards in the slide chamber 23.

These feeding steps are carried out continuously in order of succession. The further treatment and the placement of the components are also carried out continuously.

After the termination of the feeding step shown in FIG. 2 and described, that is to say after the component has been disposed on the bottom of the slide chamber 23, the transfer slide 25 is displaced in the direction of arrow 61 to the left (FIG. 3). The suction pick-up 21 has withdrawn deeper downwards into the longitudinal slot 58 of the slide 25, but remains therein and is still connected to a vacuum source. The subatmospheric pressure is adjusted so that it has a suction effect throughout the length of the slot on the upper side there of. Therefore, the component is held by the subatmospheric pressure on the bottom of the slide chamber 23 accurately in the position in which it has been placed by the suction pick-up. A means for preventing displacement of the component in the sliding direction of the slide and for further aligning is constituted by a first alignment face 60 of the slide chamber 23; the alignment with respect to it is effected automatically when the slide 25 is displaced. When the slide 25 has reached its end position shown in FIG. 3, a suction tube 27, which passes downwards through a channel 51 of an alignment chamber 47 in the guiding bottom 39, picks up the component 3' and lifts in the direction of arrow 63 it into the alignment chamber 47.

When the component 3' is lifted, two faces are of importance for checking the alignment and for a realignment, i.e. the first alignment face 60 of the slide chamber 23 and a second alignment face 65 of the alignment chamber 47. In the slide position shown in FIG. 3, the horizontal distance between the two alignment faces is about 0.05 mm longer than the corresponding length of the component 3'. The component 3' is further aligned between these two faces, in which event it has to be taken into accont that the alignment with respect to the first alignment face 60 has already been terminated when the slide has reached the end position (FIG. 3) and a realignment by means of the second alignment face 65 takes place only if this is necessary.

When the component 3' has been received by the alignment chamber 47, the transfer operation has been accomplished without the component having once more become free. The position adjusted in the feeding channel, which is applied to the elimination of tape tolerances, is consequently only realigned, which is of great importance for an accurate alignment.

The slide 25 now returns to the feeding position shown in FIG. 1 to receive a new component 3'. In the meantime the suction tube 27 guided in a sleeve 45 moves downwards in the direction of arrow 49 and brings the component 3' into the mounting position 29 on a circuit board 31. In order to guarantee the detachment of the component 3' from the suction tube 27 and its placement on the circuit board 31, a short surge of pressurized air is applied to the suction tube 27. From the instant of transfer from the carrier tape to the instant of mounting on the circuit board, the component is permanently held by suction due to subatmospheric pressure. This it achieved in that in the slot of the slide, even after withdrawal of the suction pick-up, a subatmospheric pressure is maintained which holds the component during displacement of the slide until the suction tube lifts it again. Consequently, from the instant at which it is transferred from the tape to the instant at which it is placed in the mounting position, the component never becomes free again. As a result, the alignment of the component is considerably facilitated and improved, a first alignment taking place in the feeding channel and a second alignment in the slide chamber and finally in the alignment chamber.

What is claimed is:

1. A device for transferring leadless components, in particular so-called chip-type components, from a carrier tape to a given mounting position on a circuit board, the components being supplied by the tape at regular intervals and a punch feeding each component via a feeding channel in a guiding bottom to a transfer slide, characterized in that a suction pick-up is arranged below the punch, which can be displaced axially and synchronously with the punch, whilst the component is aligned between the suction pick-up and the punch on its way towards the transfer slide in the feeding channel and is prevented from being separated from the suction pick-up until the component reaches the bottom of a slide chamber in the slide, and said suction pick-up, projecting into a slot of the transfer slide, after the component has been disposed on the bottom of the slide chamber and after the suction pick-up has been lifted off the component, maintains a sub-atmospheric pressure, which further holds the component on the bottom of the slide chamber until the component has been transferred by means of the transfer slide into a position above the mounting position and is lifted out of the slide chamber by a suction tube.

2. A device as claimed in claim 1, characterized in that a short surge of pressurized air is applied to the suction tube when the component is placed on the circuit board.

* * * * *